US006777961B2

United States Patent
Hamamoto et al.

(10) Patent No.: US 6,777,961 B2
(45) Date of Patent: Aug. 17, 2004

(54) THERMOPILE INFRARED SENSOR AND METHOD FOR INSPECTING THE SAME

(75) Inventors: Kazuaki Hamamoto, Nagoya (JP); Inao Toyoda, Anjo (JP)

(73) Assignee: Denso Corporation, Kariya (JP)

( * ) Notice: Subject to any disclaimer, the term of this patent is extended or adjusted under 35 U.S.C. 154(b) by 32 days.

(21) Appl. No.: 10/144,733

(22) Filed: May 15, 2002

(65) Prior Publication Data

US 2002/0170589 A1 Nov. 21, 2002

(30) Foreign Application Priority Data

May 18, 2001 (JP) ........................................ 2001-149529

(51) Int. Cl.[7] .............................. G01R 27/08; G01K 7/00
(52) U.S. Cl. ........................ 324/703; 136/227; 374/179
(58) Field of Search .......................... 324/703; 136/225, 136/227; 374/179

(56) References Cited

U.S. PATENT DOCUMENTS 4,111,717 A * 9/1978 Baxter ........................ 136/225
4,938,244 A * 7/1990 Kumada et al. ............ 136/225
6,339,187 B1 * 1/2002 Inoue .......................... 136/225

FOREIGN PATENT DOCUMENTS

| JP | A-6-137956 | 5/1994 |
| JP | A-11-153490 | 6/1999 |

* cited by examiner

Primary Examiner—N. Le
Assistant Examiner—Timothy J. Dole
(74) Attorney, Agent, or Firm—Posz & Bethards, PLC

(57) ABSTRACT

A sensor has a series circuit, which includes first and second end terminals, a set of thermocouples electrically connected in series between the first end terminal and the second end terminal, and electrical inspection terminals, which extend from corresponding intermediate points in the series circuit between the first end terminal and the second end terminal to divide the set of thermocouples into smaller groups of thermocouples. A resistance value of each group of thermocouples is measured through adjacent two of the first and second end terminals and the electrical inspection terminals while the sensor is in a wafer state. Whether the thermopile infrared sensor is normal is determined based on the measured resistance value of each group of thermocouples.

16 Claims, 6 Drawing Sheets

THERMOPILE INFRARED SENSOR AND METHOD FOR INSPECTING THE SAME

CROSS REFERENCE TO RELATED APPLICATION

This application is based on and incorporates herein by reference Japanese Patent Application No. 2001-149529 filed on May 18, 2001.

BACKGROUND OF THE INVENTION

1. Field of the Invention

The present invention relates to a thermopile infrared sensor, which is used in temperature measurement, image recognition, or the like.

2. Description of Related Art

A thermopile infrared sensor is a sensor that produces an output upon receiving infrared radiation. Such a sensor can be inspected while it is in a wafer state by applying infrared radiation onto the sensor and measuring an output of the sensor. However, the output substantially varies from sensor to sensor. Thus, it is difficult to detect circuit failure, such as short circuit, based on the output of the sensor. For example, even when five thermocouples out of one hundred thermocouples in a single sensor are defective due to short circuit, the remaining ninety five thermocouples outputs normally. Thus, this defective sensor can still produce 95% of the output of the normal sensor, and this value may fall within an allowable variation range. As a result, the defective sensor is likely to be shipped to a next manufacturing stage.

SUMMARY OF THE INVENTION

The present invention addresses the above disadvantage. Thus, it is an objective of the present invention to provide a thermopile infrared sensor, which allows more reliable detection of circuit failure of the sensor, such as short circuit of the sensor, while the sensor is still in a wafer state. It is another objective of the present invention to provide a method for inspecting such a thermopile infrared sensor.

To achieve the objective of the present invention, there is provided a thermopile infrared sensor including a semiconductor substrate and a series circuit formed on the semiconductor substrate. The series circuit includes first and second end terminals, a set of thermocouples electrically connected in series between the first end terminal and the second end terminal, and at least one electrical inspection terminal. The at least one electrical inspection terminal extends from a corresponding intermediate point in the series circuit between the first end terminal and the second end terminal to divide the set of thermocouples into at least two groups of thermocouples and to allow inspection of each group of thermocouples. The set of thermocouples includes dissimilar electrically conductive materials, which are alternately electrically connected in series on the semiconductor substrate such that a plurality of hot junctions and a plurality of cold junctions are alternately formed by the dissimilar electrically conductive materials.

Each hot junction shows a substantial temperature increase upon absorption of infrared radiation while each cold junction shows little or no substantial temperature increase upon absorption of the infrared radiation. An electromotive force generated by a difference in temperature between each of the hot junctions and adjacent one of the cold junctions is outputted from the series circuit through the first and second end terminals.

TO achieve the objective of the present invention, there is also provided a method for inspecting a thermopile infrared sensor having a series circuit. The series circuit includes first and second end terminals, a set of thermocouples electrically connected in series between the first end terminal and the second end terminal, and at least one electrical inspection terminal, which extends from a corresponding intermediate point in the series circuit between the first end terminal and the second end terminal to divide the set of thermocouples into at least two groups of thermocouples. The method includes steps of measuring a resistance value of each group of thermocouples through adjacent two of the first and second end terminals and the at least one electrical inspection terminal while the thermopile infrared sensor is in a wafer state, and determining whether the thermopile infrared sensor is normal based on the measured resistance value of each group of thermocouples.

BRIEF DESCRIPTION OF THE DRAWINGS

The invention, together with additional objectives, features and advantages thereof, will be best understood from the following description, the appended claims and the accompanying drawings in which:

DETAILED DESCRIPTION OF THE INVENTION

An embodiment of the present invention will be described with reference to the accompanying drawings.

A thermopile infrared sensor of the present embodiment has a thin film membrane structure.

Figure 1:
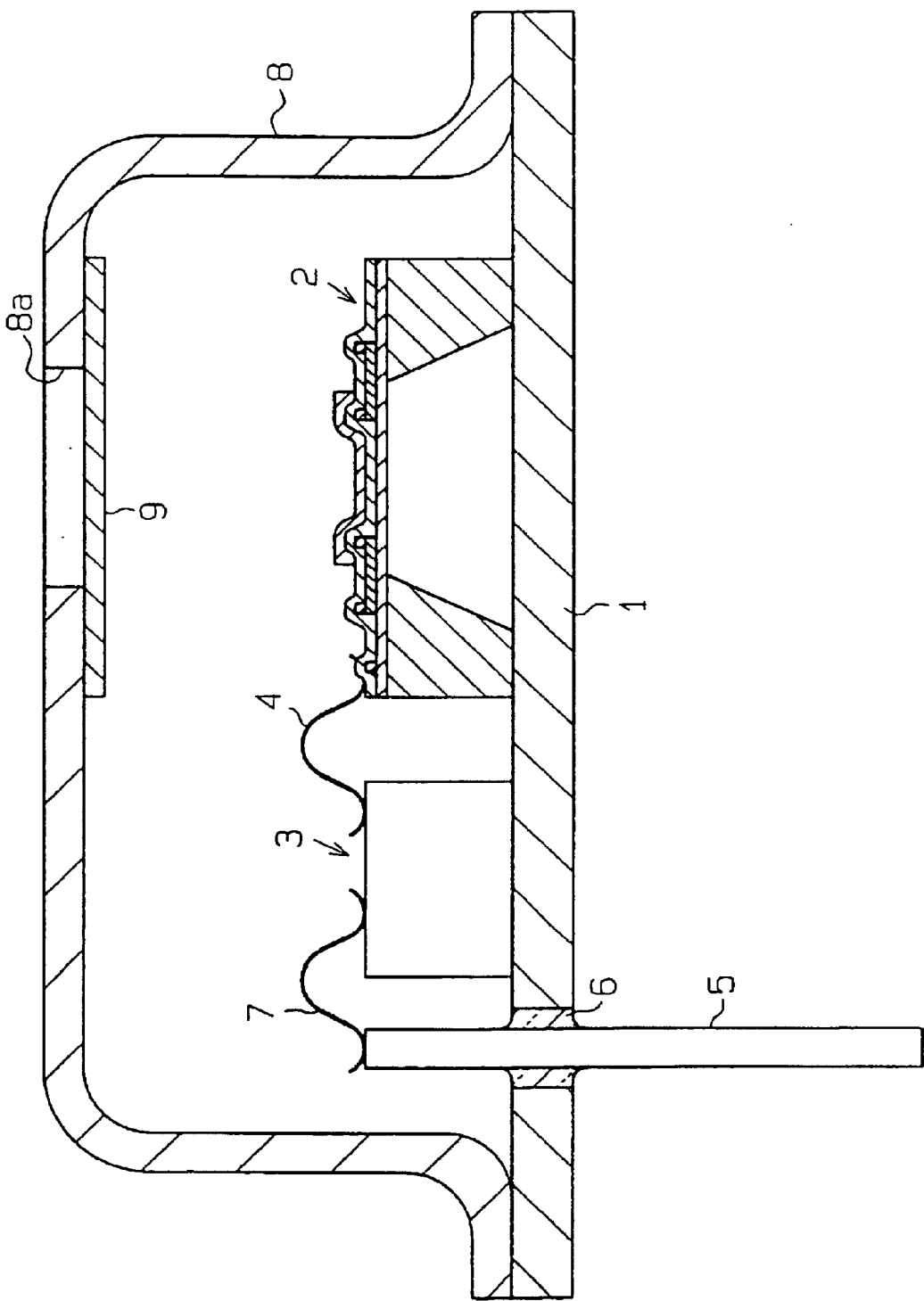
FIG. 1 is a longitudinal cross sectional view of a thermopile infrared sensor according to an embodiment of the present invention.

With reference to FIG. 1, the thermopile infrared sensor includes a sensor chip (silicon substrate) 2 and a signal processing IC chip 3, which are both secured on a stem 1. The sensor chip 2 is electrically connected to the signal processing IC chip 3 through bonding wires 4. Through holes penetrate through the stem 1, and pins 5 are received through the through holes of the stem 1 and are hermetically sealed with glass 6. Bonding wires 7 electrically connect the signal processing IC chip 3 to the pins 5.

A cap (can) 8 is arranged over the stem 1, and outer peripheral edges of the stem 1 are sealingly secured (seal welded) to the cap 8. The sensor chip 2, the signal processing IC chip 3, and the pins 5 are located in an interior of the cap 8. The interior of the cap 8 is substantially vacuumed or is filled with a gas having low thermal conductivity to improve a sensitivity of the sensor chip 2. Examples of the gas having the low thermal conductivity include xenon gas or the like.

An opening (window) 8a penetrates through a top wall of the cap 8, and a filter 9 is attached to an inner surface of the cap 8 to cover the opening 8a. Infrared radiation is applied onto the sensor chip 2 through the opening 8a and the filter 9.

Figure 2:
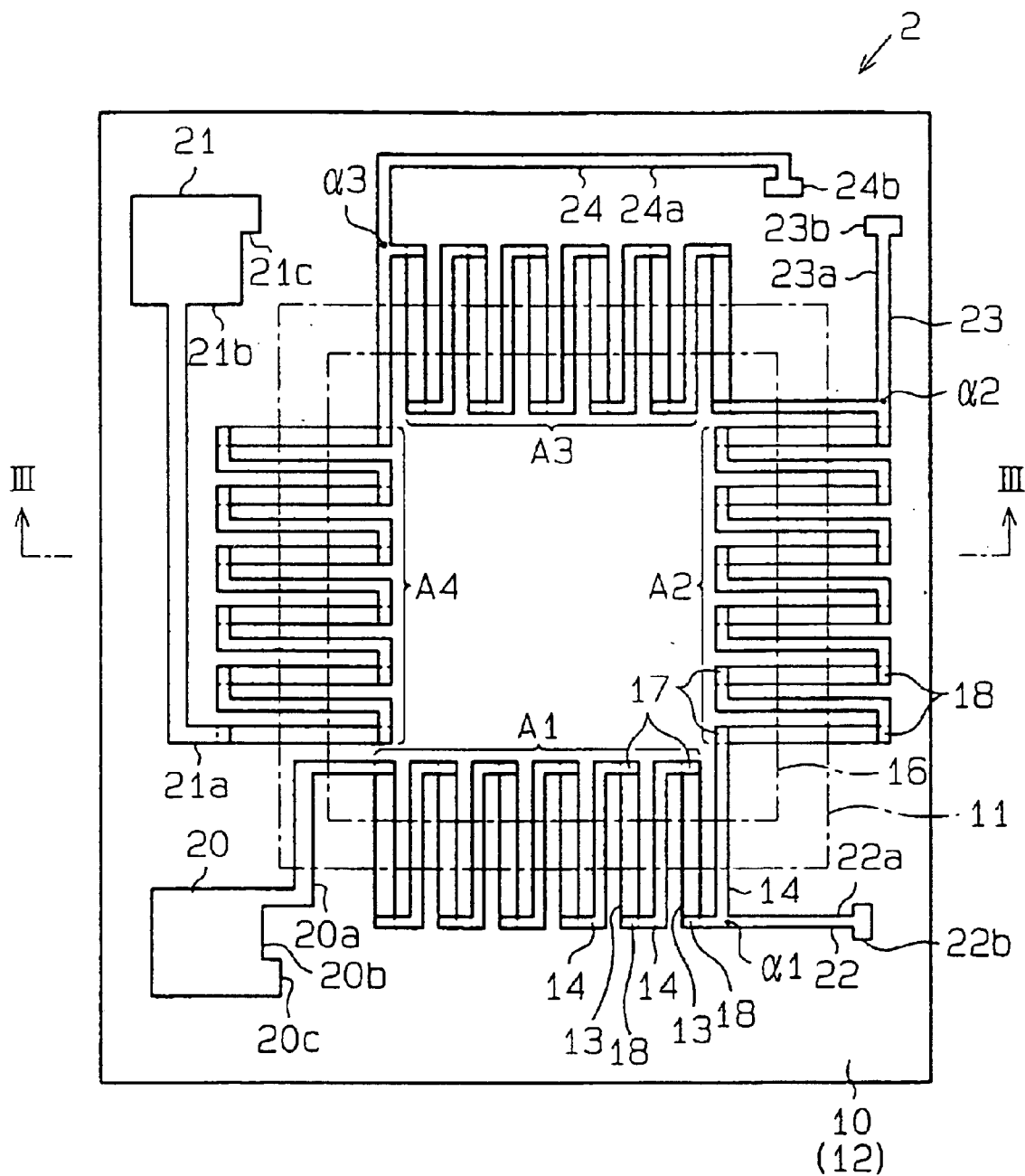
FIG. 2 is a plan view of a sensor chip (silicon substrate) of the sensor.
Figure 3:
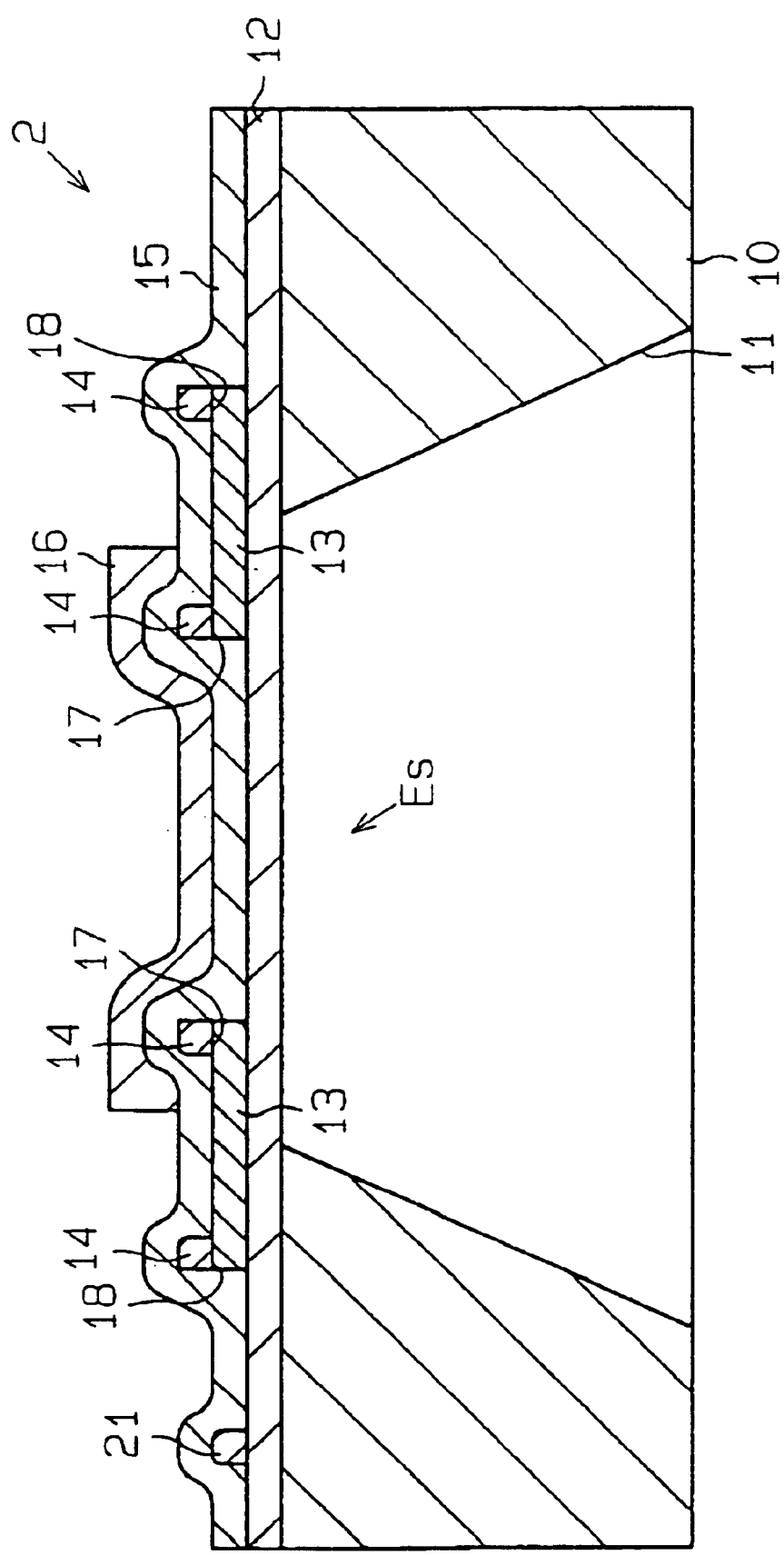
FIG. 3 is a cross sectional view taken along line III—III in FIG. 2.

An insulation film (passivation film) 15 and an infrared absorbing film 16 shown in FIG. 3 are eliminated in FIG. 2 for the sake of clarity.

In FIGS. 2 and 3, a through hole 11 penetrates through the center of a silicon substrate (semiconductor substrate) 10. The through hole 11 is formed by etching the silicon substrate 10 from its underside (lower side in FIG. 3). A silicon nitride film 12 is arranged on the top surface of the silicon substrate 10, and an opening at the upper end of the through hole 11 is closed by the silicon nitride film 12. In place of the silicon nitride film 12, any other appropriate insulation film, such as a silicone oxide film, can be used.

Elongated polysilicon films 13 doped with an n-type impurity are patterned over the silicon nitride film 12. Elongated aluminum thin films 14 are also patterned over the silicon nitride film 12. The elongated n-type polysilicon films 13 and the elongated aluminum thin films 14 are alternately arranged along a plane in such a manner that ends of the adjacent films 13, 14 are partially overlapped each other. More specifically, the elongated n-type polysilicon films 13 and the elongated aluminum thin films 14 are alternately connected in series to form a series circuit 40 (FIG. 5) along the plane in such a manner that the ends of the adjacent films 13, 14 are partially overlapped each other.

The passivation film 15 made of silicon nitride is formed over the films 13, 14. The infrared absorbing film 16 is formed over a predetermined area of the passivation film 15. The infrared absorbing film 16 is made, for example, of gold black. The passivation film 15 is removed from portions of the films 13, 14, at which the bonding wires are connected.

The infrared absorbing film 16 is shaped into a quadrangle shape and is arranged at the center of the silicon substrate 10, as shown in FIGS. 2 and 3. Each first overlapping portion (first junction) 17 between each elongated n-type polysilicon film 13 and the adjacent elongated aluminum thin film 14 is placed under the infrared absorbing film 16. Each second overlapping portion (second junction) 18 between each elongated n-type polysilicon film 13 and the adjacent elongated aluminum thin film 14 is placed in a location where no infrared absorbing film 16 is present (outside of the infrared absorbing film 16). Each first overlapping portion 17 and the adjacent second overlapping portion 18 are paired, and a number of these pairs are formed to constitute a set of thermocouples (thermopile), which has a Seebeck coefficient.

As described above, the dissimilar electrically conductive materials 13 and 14 are alternately electrically connected in series on the silicon substrate 10. Furthermore, each first junction 17 is made as a hot junction, which shows a substantial temperature increase upon absorption of the infrared radiation. Each second junction 18 is made as a cold junction, which shows little or no substantial temperature change upon absorption of the infrared radiation. An electromotive force, which is generated by a difference in temperature between the hot junction 17 and the cold junction 18, can be outputted from the series circuit 40 through the first and second end terminals 20, 21. In this embodiment, the through hole 11 is formed in the center of the silicon substrate 10, and a sensor element Es (FIG. 3) having the thin film membrane structure is arranged over the opening of the through hole 11, which is located on the top surface of the silicon substrate 10 in FIG. 3. The hot junctions 17 are all located within the portion of the film membrane structure, which is placed over the through hole 11 of the silicon substrate 10, to reduce a heat capacity of each hot junction 17. On the other hand, the cold junctions 18 are all located over the silicon substrate 10, and thus the silicon substrate 10 acts as a heat sink of each cold junction 18.

When infrared radiation is applied onto the sensor chip 2 through the opening 8a and the filter 9 shown in FIG. 1, the infrared radiation is absorbed by the infrared absorbing film 16 (FIGS. 2 and 3) and is transformed into heat. An electromotive force is generated by the heat at the overlapping portions (junctions) 17, 18 of the n-type polysilicon films 13 and the aluminum thin films 14. This electromotive force is outputted from the sensor chip 2 to the signal processing IC chip 3 through the bonding wires 4 shown in FIG. 1. The signal processing IC chip 3 carries out a signal processing operation (such as an amplifying operation) of the signal outputted from the sensor chip 2. Then, the processed signal is outputted from the signal processing IC chip 3 as a sensor signal through the bonding wires 7 and the pins 5.

Specifically, when infrared radiation is emitted from a human body or the like, the infrared absorbing film 16 absorbs the infrared radiation, so that the temperature of the infrared absorbing film 16 rises. As a result, the temperature of each hot junction 17 placed under the infrared absorbing film 16 also rises. However, the temperature of each cold junction 18 does not rise substantially since the silicon substrate 10 acts as the heat sink. As a result, a difference in temperature between the hot junction 17 and the cold junction 18 develops, and an electromotive force is generated due to the Seebeck effect. In the thermopile (the set of thermocouples), the thermocouples are connected in series, as shown in FIG. 4, and the sum of the electromotive forces of the thermocouples is outputted as the sensor output $V_{out}$.

Figure 4:
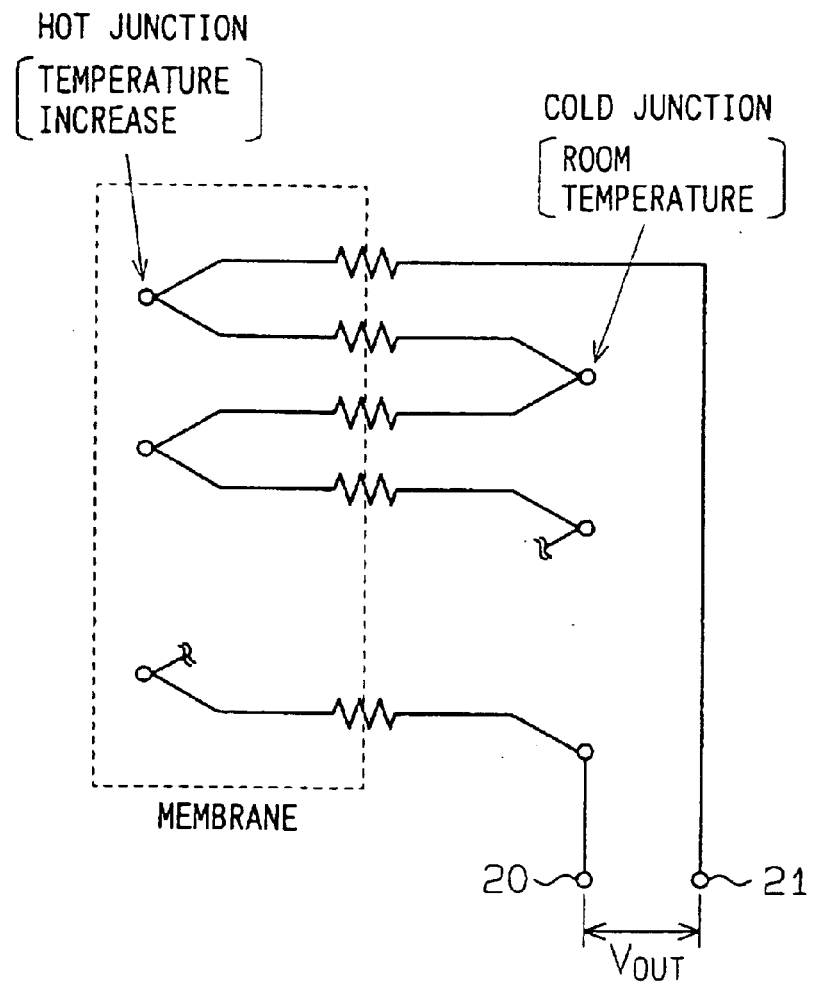
FIG. 4 is a schematic view showing operational principles of a thermopile (a set of thermocouples)
Figure 9:
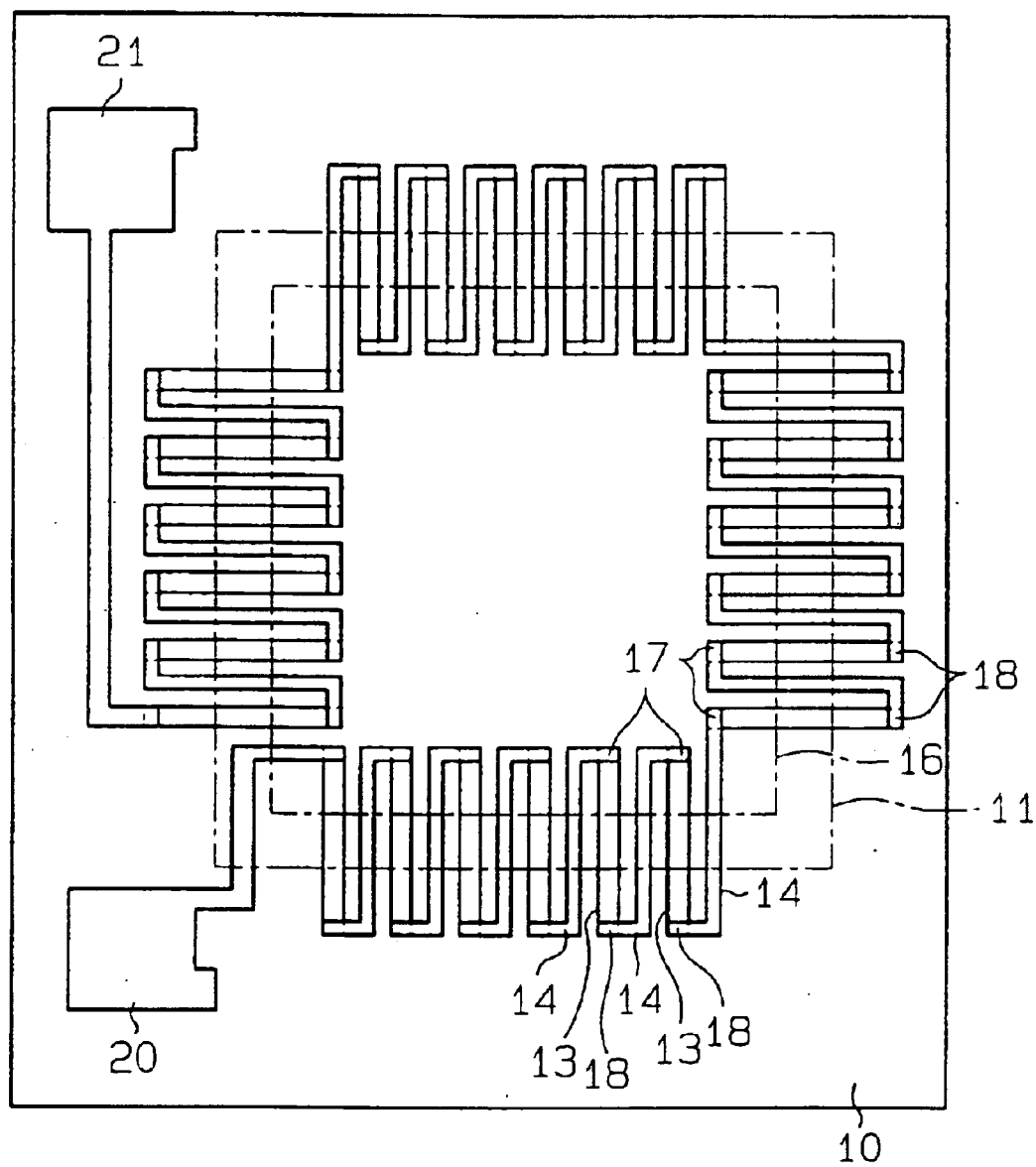
FIG. 9 is a plan view of a comparative exemplary sensor chip (silicon substrate)
Figure 10:
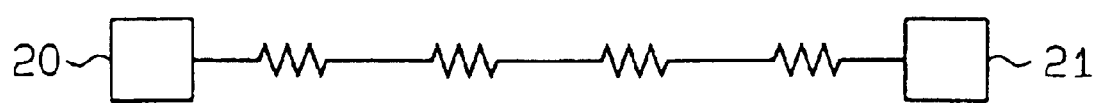
FIG. 10 is a circuit diagram showing a comparative exemplary series circuit of a sensor chip.

The thermocouples of the thermopile (the set of thermocouples) are connected in series, and the sensor output is outputted through the first and second end terminals 20, 21, as shown in FIG. 4. In general, about several tens to one hundred of the thermocouples are connected in series to increase the output. A resistance value of the entire thermopile can be measured through the terminals 20, 21. However, the resistance value of the entire thermopile varies from lot to lot and from wafer to wafer. Thus, even if several thermocouples of each thermopile are short circuited, a change in the resistance value of the entire thermopile, which is caused by the short circuiting of the several thermocouples, is relatively small and is generally falls within an allowable variation range of the resistance value of the thermopile. Thus, the short circuiting or failure of the several thermocouples cannot be detected through the measurement of the resistance value of the entire thermopile. That is, if a large number of thermocouples are connected in series in a manner shown in FIG. 9, and a resistance value of the entire thermopile is measured through the terminals 20, 21 of the series circuit shown in FIG. 10, short circuiting of several thermocouples of the thermopile cannot be detected through the measurement of the resistance value of the entire thermopile.

Figure 5:
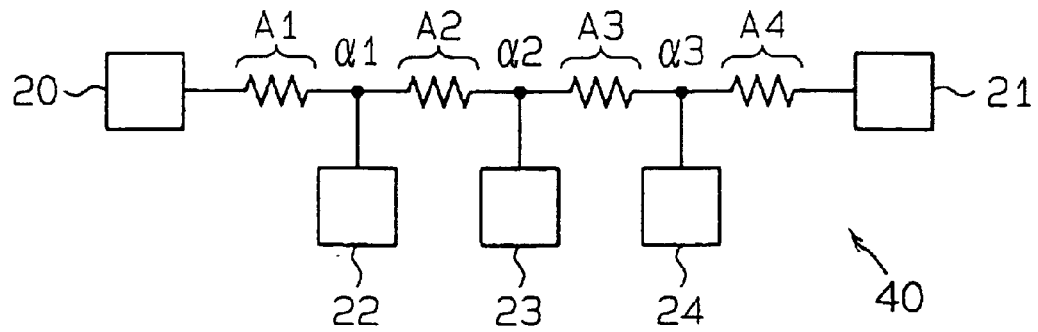
FIG. 5 is a circuit diagram showing a series circuit of the sensor chip of the embodiment.

In the present embodiment, as shown in FIGS. 2 and 5, aluminum wirings 22a, 23a, 24a branch out from branching points (intermediate points) in the aluminum portions (α1, α2, α3 in FIG. 2) of the series circuit 40, which includes the thermocouples connected in series. A wider probe contacting portion 22b, 23b, 24b is formed in a distal end of each aluminum wiring 22a, 23a, 24a. Thus, several electrical inspection terminals 22, 23, 24 are provided. The electrical inspection terminals 22, 23, 24 allow division of the thermocouples into several smaller groups, and each smaller group of thermocouples can be inspected through the corresponding electrical inspection terminals 22, 23, 24.

A way of dividing the thermocouples into the smaller groups will be described. With reference to FIG. 2, the thermocouples are arranged along four edges of the quadrangular infrared absorbing film 16 and also along four edges of the quadrangular through hole 11. Terminal aluminum wirings 20a, 21a of the first and second end terminals 20, 21 extend from corresponding aluminum portions of the series circuit 40 at one of four corners of the quadrangular infrared absorbing film 16. A wider bonding pad 20b, 21b and a probe contacting portion 20c, 21c are connected to a distal end of each aluminum wiring 20a, 21a. The branching points α1, α2, α3 are formed near the remaining three corners, respectively, of the quadrangular infrared absorbing film 16. Thus, the thermocouples are divided into first to fourth smaller groups by the electrical inspection terminals 22, 23, 24. The first to fourth groups of thermocouples are located along the four edges, respectively, of the quadrangular infrared absorbing film 16. A resistance value of each smaller group of thermocouples (this resistance value is mainly of the resistance value of the polysilicon films 13 doped with the impurity) can be measured with use of the adjacent two of the electrical inspection terminals 22, 23, 24 and the end terminals 20, 21. With reference to FIG. 2, the areas where the four edges are located, respectively, will be referred to as first to fourth areas A1–A4. The same number of thermocouples are provided in each area A1–A4, and thus each area A1–A4 shows the same electrical characteristics.

The passivation film 15 is removed from the probe contacting portions 22b, 23b, 24b of the electrical inspection terminals 22–24, so that it is possible to electrically contact the probes to the probe contacting portions 22b, 23b, 24b.

A variation in the resistance value among the first to fourth groups of thermocouples, which are located in the areas A1–A4, respectively, should be relatively small since the first to fourth groups of thermocouples are all arranged in the same sensor chip. Thus, in the normal sensor chip, a ratio (resistance ratio) of a resistance value of the first group of thermocouples in the first area A1, a resistance value of the second group of thermocouples in the second area A2, a resistance value of the third group of thermocouples in the third area A3 and a resistance value of the fourth group of thermocouples in the fourth area A4 should be 1:1:1:1.

On the other hand, if circuit failure, such as short circuit, occurs, the above resistance ratio changes. To determine occurrence of the circuit failure, an allowable variation range of the resistance ratio (upper and lower threshold values for determining whether the resistance ratio is acceptable) is provided. During inspection, if the measured resistance ratio falls out of the allowable variation range, the corresponding sensor chip 2 is determined to be abnormal. This inspection is carried out while the sensor chip 2 is still in a wafer state, and the abnormal sensor chip is removed from the manufacturing line.

The inspection of the sensor chip 2 in the wafer state will be described in greater details.

In manufacturing, the through hole 11 of each sensor chip 2 is first formed in a wafer, and then the films 12, 13, 14, 15, 16 of the sensor chip 2 are formed (patterned), as shown in FIG. 3. At this state, the circuit failure, such as the short circuit, is inspected. More specifically, with reference to FIG. 5, a resistance value X1 of the first group of thermocouples in the first area A1 is measured between the terminal 20 and the terminal 22. A resistance value X2 of the second group of thermocouples in the second area A2 is measured between the terminal 22 and the terminal 23. A resistance value X3 of the third group of thermocouples in the third area A3 is measured between the terminal 23 and the terminal 24. A resistance value X4 of the fourth group of thermocouples in the fourth area A4 is measured between the terminal 24 and the terminal 21. Then, a resistance ratio of X1:X2:X3:X4 is calculated, and it is determined whether the resistance ratio falls within the allowable variation range.

If the resistance ratio does not fall within the allowable variation range, i.e., if the corresponding sensor chip is determined to be defective, the region of the sensor chip in the wafer is marked to indicate the defectiveness of the sensor chip, so that the defective sensor chip is removed from the manufacturing line later on.

On the other hand, if all the sensor chips in the wafer are normal, the wafer is shipped to the next manufacturing stage where the wafer is diced into individual chips. Thereafter, the sensor chip 2 (silicon substrate 10) and the signal processing IC chip 3 are secured to the stem 1, as shown in FIG. 1. Next, the sensor chip 2 is electrically connected to the signal processing IC chip 3 with the bonding wires 4, and the signal processing IC chip 3 is electrically connected to the pins 5 with the bonding wires 7.

Then, the cap (can) 8 is placed over the stem 1, and the outer peripheral edges of the stem 1 and the outer peripheral edges of the cap 8 are welded together. Thus, the manufacturing of the thermopile infrared sensor is completed.

As described above, due to the variations in the sensor output value among the sensor chips, it is difficult to detect the failure of the thermocouples, such as the short circuit of the thermocouples, based only on the sensor output value. For example, even if five thermocouples out of one hundred thermocouples are defective due to the sort circuit, the remaining ninety five normal thermocouples can provide normal outputs. Thus, this defective sensor chip can still provide 95% of the total output of the normal sensor chip, and this value falls within the allowable variation range. As a result, the defective sensor chip is likely to be shipped to the next manufacturing stage. Then, when a degree of the short circuit state of the defective sensor chip is changed, an accurate result cannot be obtained from the signal processing IC chip (i.e., the relationship between the output and the temperature is changed, causing improper measurement). Alternatively, the short circuit in the defective sensor chip can be found through visual examination of the sensor chip after the dicing of the wafer. However, the visual examination is normally carried out after the dicing of the wafer, so that it is desirable to find the short circuit at an earlier manufacturing stage. Contrary to this, in the present embodiment, the resistance values X1, X2, X3, X4 of the first to fourth groups of thermocouples, which are divided by the electrical inspection terminals 22, 23, 24, are measured through the electrical inspection terminals 22, 23, 24 and the first and second end terminals (i.e., the electrical inspection terminals located at the ends of the series circuit) 20, 21 of the series circuit 40 while the sensor chip is still in the wafer state. Then, it is determined whether the sensor chip is defective based on the measured resistance values X1, X2, X3, X4.

Thus, the provision of the electrical inspection terminals 22, 23, 23 in the series circuit 40, which is formed by connecting the thermocouples in series, allows detection of the circuit failure of the sensor chip, such as the short circuit, based on the measured resistance values (the ratio of the measured resistance values) X1–X4 while the sensor chip is still in the wafer state. Thus, shipment of the defective sensor chips to the following manufacturing stage can be effectively prevented. Although the resistance value of the set of thermocouples (the resistance value of the thermopile) may vary substantially from lot to lot and from wafer to wafer, the resistance value of the group of thermocouples does not vary largely from group to group in the same sensor chip. Thus, the circuit failure, such as the short circuit, can be more reliably detected.

The circuit arrangement shown in FIG. 5 can be modified as follows.

Figure 6:
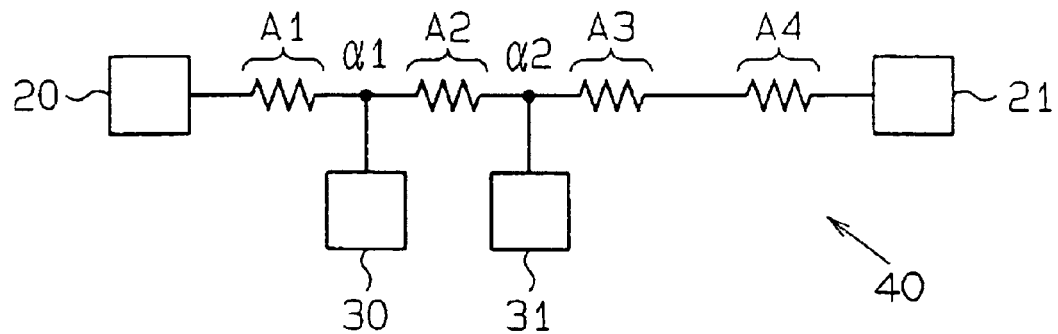
FIG. 6 is a circuit diagram showing a modification of the series circuit of the embodiment.

That is, as shown in FIG. 6, electrical inspection terminals 30, 31 can be extended from the branching points α1, α2, respectively, of the series circuit 40. While the sensor chip is in the wafer state, a resistance value X1 of the group of thermocouples in the first area A1 between the terminal 20 and the terminal 30 is measured. Also, a resistance value X2 of the group of thermocouples in the second area A2 between the terminal 30 and the terminal 31 is measured. Furthermore, a resistance value X34 of a group of thermocouples in the third and fourth areas A3, A4 between the terminal 31 and the terminal 21 is measured. Then, a resistance ratio of X1:X2:X34 is calculated, and it is determined whether this resistance ratio falls within a predetermined allowable variation range. An ideal resistance ratio (i.e., the resistance ratio of the normal sensor chip) of X1:X2:X34 is 1:1:2.

Figure 7:
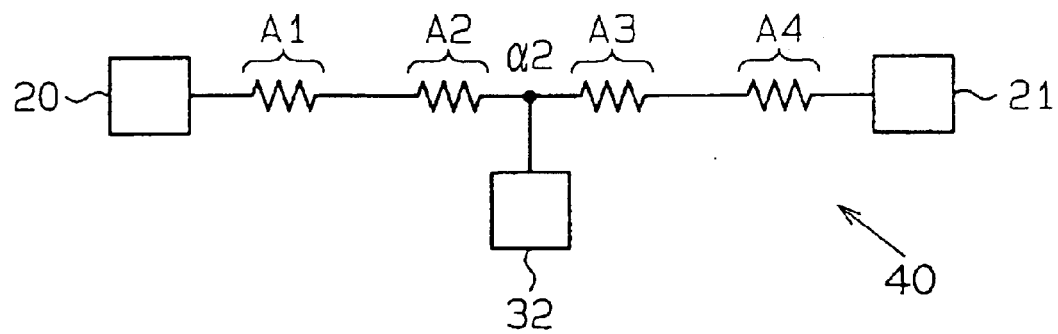
FIG. 7 is a circuit diagram showing another modification of the series circuit of the embodiment.

Also, the circuit arrangement can be modified in a manner shown in FIG. 7. That is, an electrical inspection terminal 32 can be extended from the branching point α2 of the series circuit 40. A resistance value X12 of a group of thermocouples in the first and second areas A1, A2 between the terminal 20 and the terminal 32 is measured. Also, a resistance value X34 of a group of thermocouples in the third and fourth areas A3, A4 between the terminal 32 and the terminal 21 is measured. Then, a resistance ratio of X12:X34 is calculated, and it is determined whether this resistance ratio falls within a predetermined allowable variation range. An ideal resistance ratio (i.e., the resistance ratio of the normal sensor chip) of X12:X34 is 1:1.

Figure 8:
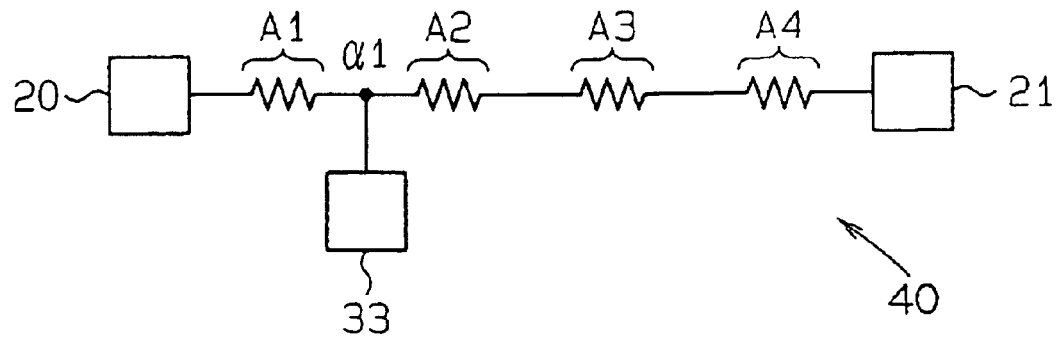
FIG. 8 is a circuit diagram showing a further modification of the series circuit of the embodiment.

Furthermore, the circuit arrangement can be modified in a manner shown in FIG. 8. That is, an electrical inspection terminal 33 can be extended from the branching point α1 of the series circuit 40. A resistance value X1 of the group of thermocouples in the first area A1 between the terminal 20 and the terminal 33 is measured. Also, a resistance value X234 of a group of thermocouples in the second, third and fourth areas A2, A3, A4 between the terminal 33 and the terminal 21 is measured. Then, a resistance ratio of X1:X234 is calculated, and it is determined whether this resistance ratio falls within a predetermined allowable variation range. An ideal resistance ratio (i.e., the resistance ratio of the normal sensor chip) of X1:X234 is 1:3.

In the above embodiment, as shown in FIG. 2, although the probe contacting portions 20c, 21c for the electrical inspection are provided in the terminals 20, 21 of the series circuit 40, these probe contacting portions 20c, 21c can be eliminated, if appropriate. In such a case, the resistance value can be measured through the bonding pads 20b, 21b.

Furthermore, the signal processing IC chip 3 can be eliminated from the thermopile infrared sensor, if a signal processing device for processing the signal of the sensor chip 2 is provided externally of the sensor. In such a case, the sensor chip 2 is directly connected to the pins 5 through boding wires.

Additional advantages and modifications will readily occur to those skilled in the art. The invention in its broader terms is therefore, not limited to the specific details, representative apparatus, and illustrative examples shown and described.

What is claimed is:

1. A thermopile infrared sensor comprising:
a semiconductor substrate; and
a series circuit formed on the semiconductor substrate, wherein the series circuit includes:
first and second end terminals;
a set of thermocouples electrically connected in series between the first end terminal and the second end terminal, wherein the set of thermocouples includes dissimilar electrically conductive materials, which are alternately electrically connected in series on the semiconductor substrate such that a plurality of hot junctions and a plurality of cold junctions are alternately formed by the dissimilar electrically conductive materials, wherein each hot junction shows a substantial temperature increase upon absorption of infrared radiation while each cold junction shows little or no substantial temperature increase upon absorption of the infrared radiation, and wherein an electromotive force generated by a difference in temperature between each of the hot junctions and adjacent one of the cold junctions is outputted from the series circuit through the first and second end terminals; and
at least one electrical inspection terminal, which has an uncovered surface area smaller than that of each of the first and second end terminals, and which extends from a corresponding intermediate point in the series circuit between the first end terminal and the second end terminal to divide the set of thermocouples into at least two groups of thermocouples and to allow inspection of each group of thermocouples.

2. A thermopile infrared sensor according to claim 1, further comprising an infrared absorbing film for absorbing the infrared radiation, wherein:
the hot junctions are placed under the infrared absorbing film;
the semiconductor substrate includes a through hole, which penetrates through a center of the semiconductor substrate; and
the infrared absorbing film and the hot junctions are placed at one end of the through hole.

3. A thermopile infrared sensor according to claim 2, wherein:
the infrared absorbing film has a quadrangular shape having four edges; and
the set of thermocouples is arranged along the four edges of the infrared absorbing film in such a manner that an equal number of the thermocouples is arranged along each of the four edges of the infrared absorbing film.

4. A thermopile infrared sensor according to claim 1, further comprising a passivation film, which covers each hot junction and each cold junction.

5. A method for inspecting a thermopile infrared sensor having a series circuit, wherein the series circuit includes first and second end terminals, a set of thermocouples electrically connected in series between the first end terminal and the second end terminal, and at least one electrical inspection terminal, which extends from a corresponding intermediate point in the series circuit between the first end terminal and the second end terminal to divide the set of thermocouples into at least two groups of thermocouples, the method comprising steps of:

measuring a resistance value of each group of thermocouples through adjacent two of the first and second end terminals and the at least one electrical inspection terminal while the thermopile infrared sensor is in a wafer state; and determining whether the thermopile infrared sensor is normal based on the measured resistance value of each group of thermocouples.

6. A method according to claim 5, wherein whether the thermopile infrared sensor is normal is determined based on a ratio of the resistance values of the at least two groups of thermocouples.

7. A method according to claim 5, wherein the at least two groups of thermocouples are equal in size.

8. A thermopile infrared sensor comprising:

a semiconductor substrate; and a series circuit formed on the semiconductor substrate, wherein the series circuit includes:

first and second end terminals;

a set of thermocouples electrically connected in series between the first end terminal and the second end terminal, wherein the set of thermocouples includes dissimilar electrically conductive materials, which are alternately electrically connected in series on the semiconductor substrate such that a plurality of hot junctions and a plurality of cold junctions are alternately formed by the dissimilar electrically conductive materials, wherein each hot junction shows a substantial temperature increase upon absorption of infrared radiation while each cold junction shows little or no substantial temperature increase upon absorption of the infrared radiation, and wherein an electromotive force generated by a difference in temperature between each of the hot junctions and adjacent one of the cold junctions is outputted from the series circuit through the first and second end terminals; and at least one electrical inspection terminal, which extends from a corresponding intermediate point in the series circuit between the first end terminal and the second end terminal to divide the set of thermocouples into at least two groups of thermocouples and to allow inspection of each group of thermocouples, wherein the at least one electrical inspection terminal is spaced away from each hot junction and each cold junction.

9. A thermopile infrared sensor according to claim 8, wherein the first and second end terminals are spaced away from each of the plurality of hot junctions and cold junctions.

10. A thermopile infrared sensor comprising:

a semiconductor substrate; and a series circuit formed on the semiconductor substrate, wherein the series circuit includes:

a first end terminal;

a second end terminal;

two or more thermocouples electrically connected in series between the first end terminal and the second end terminal; and one or more intermediate inspection terminals, extending from one or more intermediate points in the series circuit, respectively, between the first end terminal and the second end terminal, wherein the one or more inspection terminals are spaced away from the two or more thermocouples.

11. A thermopile infrared sensor according to claim 10, further comprising an infrared absorbing film formed over a portion of the series circuit, wherein the infrared absorbing film is formed over hot junctions in the two or more thermocouples, but not over cold junctions in the two or more thermocouples.

12. A thermopile infrared sensor according to claim 11, wherein:

the infrared absorbing film has a quadrangular shape having four edges; and the two or more thermocouples comprise at least four thermocouples arranged along the four edges of the infrared absorbing film in such a manner that an equal number of the at least four thermocouples are arranged along each of the four edges of the infrared absorbing film.

13. A thermopile infrared sensor according to claim 10, wherein the semiconductor substrate includes a through hole, which penetrates through a center of the semiconductor substrate, wherein hot junctions in the two or more thermocouples are placed proximate to the through hole, and cold junctions in the two or more thermocouples are placed proximate to the semiconductor substrate, such that the semiconductor substrate acts as a heat sink for the cold junctions but does not act as a heat sink for the hot junctions.

14. A thermopile infrared sensor according to claim 13, wherein:

the through hole has a quadrangular shape having four edges; and the two or more thermocouples comprise at least four thermocouples arranged along the four edges of the through hole in such a manner that an equal number of the at least four thermocouples are arranged along each of the four edges of the through hole.

15. A thermopile infrared sensor according to claim 10, further comprising a passivation film that covers a hot junction and a cold junction in each of the two or more thermocouples.

16. A thermopile infrared sensor according to claim 10, wherein the first and second end terminals are spaced away from the two or more thermocouples.

* * * * *